United States Patent [19]

Wong

[11] Patent Number: 5,270,255
[45] Date of Patent: Dec. 14, 1993

[54] METALLIZATION PROCESS FOR GOOD METAL STEP COVERAGE WHILE MAINTAINING USEFUL ALIGNMENT MARK

[75] Inventor: George Wong, Singapore, Singapore

[73] Assignee: Chartered Semiconductor Manufacturing Pte, Ltd., Singapore, Singapore

[21] Appl. No.: 2,416

[22] Filed: Jan. 8, 1993

[51] Int. Cl.⁵ .......................................... H01L 21/44
[52] U.S. Cl. .................... 437/194; 437/199; 437/190; 437/924; 148/DIG. 102
[58] Field of Search ............... 437/194, 197, 199, 190, 437/924; 148/DIG. 102, DIG. 106

[56] References Cited

U.S. PATENT DOCUMENTS

| | | | |
|---|---|---|---|
| 4,520,554 | 6/1985 | Fisher | 437/199 |
| 4,936,930 | 6/1990 | Gruber et al. | 148/DIG. 102 |
| 4,970,176 | 11/1990 | Tracy et al. | 437/197 |
| 4,981,529 | 1/1991 | Tsujita | 148/DIG. 102 |
| 5,002,902 | 3/1991 | Watanabe | 437/235 |
| 5,106,432 | 4/1992 | Matsumoto et al. | 148/DIG. 102 |
| 5,106,781 | 4/1992 | DeVries | 437/194 |
| 5,108,951 | 4/1992 | Chen et al. | 437/194 |
| 5,175,125 | 12/1992 | Wong | 437/194 |

FOREIGN PATENT DOCUMENTS

| | | | |
|---|---|---|---|
| 60-39829 | 3/1985 | Japan | 148/DIG. 102 |
| 63-311741 | 12/1988 | Japan | 148/DIG. 102 |
| 1-272133 | 10/1989 | Japan | 148/DIG. 102 |

OTHER PUBLICATIONS

H. Ono et al. "Development of a Planarized Al-Si Contact Filling Technology", IEEE VMIC Conference Proceedings, Jun. 1990, pp. 76-82.

F. S. Chen et al "Planarized Aluminum Metallization For Sub-0.5 micron CMOS Technology", IEDM 90, pp. 51-53.

C. S. Park et al "Al-PLAPH (Aluminum-Planarization By Post Heating) Process For Planarized Double Metal CMOS Applications", IEEE VMIC Conference Proceedings, Jun. 1990, pp. 326-328.

Primary Examiner—Brian E. Hearn
Assistant Examiner—Michael Trinh
Attorney, Agent, or Firm—George O. Saile

[57] ABSTRACT

A new method of metallization of an integrated circuit is described. Semiconductor device structures are fabricated in and on a semiconductor substrate. At least one contact opening to the semiconductor substrate and at least one lithography alignment cross mark opening structure are formed. A barrier layer is preferably sputtered within the contact openings and over the semiconductor device structures. A cold aluminum seed layer is sputtered over all surfaces of the contact openings. Next, a hot aluminum flow layer is provided to obtain the desired step coverage of the contact openings. A second cold aluminum layer is then sputtered onto the hot aluminum layer to define the edges of the wide lithography alignment marks while maintaining good contact opening coverage.

12 Claims, 3 Drawing Sheets

METALLIZATION PROCESS FOR GOOD METAL STEP COVERAGE WHILE MAINTAINING USEFUL ALIGNMENT MARK

BACKGROUND OF THE INVENTION (1) Field of the Invention

The invention relates to a metallization process for integrated circuit devices, and more particularly, to a metallization process with good step coverage for high aspect ratio, submicron contact/via holes while maintaining an effective alignment cross-mark structure.

(2) Description of the Prior Art

Typically, step coverage is poor for the metallization of high aspect ratio, submicron contact or via openings. Typical solutions use a plug process and planarization to completely fill the contact or via holes. Such processes are described in "Development of a Planarized Al—Si Contact Filling Technology" by Hisako Ono, Yukihiro Ushiku, and Takashi Yoda, IEEE VMIC Conference Proceedings, Jun. 12-13, 1990, pp. 76-82, "Planarized Aluminum Metallization for Sub-0.5 um CMOS Technology" by F. S. Chen, Y. S. Lin, G. A. Dixit, R. Sundaresan, C. C. Wei, and F. T. Liou, IEDM 90, pp. 51-53, "Al-PLAPH (Aluminum-Planarization by Post-Heating) Process For Planarized Double Metal CMOS Applications" by C. S. Park, S. I. Lee, J. H. Park, J. H. Sohn, D. Chin, and J. G. Lee, IEEE VMIC Conference Proceedings, Jun. 12-13, 1990, pp. 326-328, and U.S. Pat. No. 4,970,176 to Tracy et al.

In their paper, Ono et al describe a plug process in which a barrier layer is sputter deposited, followed by an Al—1% Si film at 500° C., which is then etched away. An Al-Si-Cu film is then deposited, patterned, and etched to form a plug for the contact openings. Chen et al, in their paper, describe a process similar to Ono's, but without the extra process steps of removing the first aluminum film and depositing a second aluminum film. Park et al describe a process of sputtering Al—1% Si—0.5% Cu at below 100° C., heating to 400-550° C. to anneal, then depositing additional aluminum to the desired thickness. These plug methods all require the contact holes to be completely filled.

The patent to Tracy et al describes a process consisting of depositing an aluminum alloy at a temperature of less than or equal to 200° C. This deposition will comprise 50 to 75% of the total thickness required to fill the contact hole. The temperature is increased to 400°-500° C. to reflow the aluminum, then more is added at one or more rates of sputtering. The problem that may occur here is that the thickness of the "cold" aluminum alloy may cause voids within the contact holes which may not be filled by the subsequent reflow.

A further consideration in contact hole metallization not evident in the references cited above is the issue of lithographic alignment marks. Alignment marks are formed as holes in the dicing lines between devices so as to properly align the photomask and the wafer. If the alignment holes are filled with metal, effective detection becomes difficult or impossible. In his U.S. Pat. No. 5,002,902, Watanabe discusses this problem. He says that it is common to provide additional alignment marks after any sputtering. This requires additional steps and must be done each time a conductor layer is provided. Watanabe describes a method of forming alignment holes deeper than the contact holes so that the alignment holes will not be filled when the contact holes are filled. U.S. Pat. No. 4,981,529 to Tsujita describes how to position alignment marks so that they can be recognized properly under a resist film.

SUMMARY OF THE INVENTION

A principal object of the present invention is to provide an effective and very manufacturable method of metallization of an integrated circuit which will improve step coverage of contact and via holes while not filling completely mask alignment holes.

Another object of the present invention is to provide a method of metallization which provides an effective alignment cross mark opening structure which will not require a change to the existing reticle set.

In accordance with the objects of this invention a new method of metallization of an integrated circuit is achieved. Semiconductor device structures are fabricated in and on a semiconductor substrate. At least one contact opening to the semiconductor substrate and at least one lithography alignment cross mark opening structure are formed. A barrier layer is preferably sputtered within the contact openings and over the semiconductor device structures. A cold aluminum seed layer is sputtered over all surfaces of the contact openings. Next, a hot aluminum flow layer is provided to obtain the desired step coverage of the contact openings. A second cold aluminum layer is then sputtered onto the hot aluminum layer to define the edges of the wide lithography alignment marks while maintaining good contact opening coverage.

BRIEF DESCRIPTION OF THE DRAWINGS

In the accompanying drawings forming a material part of this description, there is shown.

DESCRIPTION OF THE PREFERRED EMBODIMENTS

Figure 1:
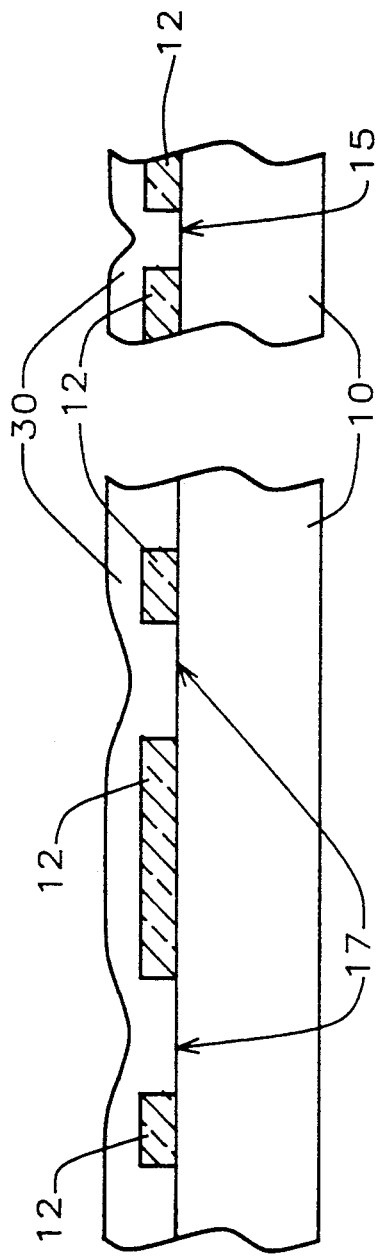
FIG. 1 schematically illustrates in cross-sectional representation an alignment mark opening and a contact opening of the prior art.

Referring now more particularly to FIG. 1, there is shown a portion of a partially completed integrated circuit. The semiconductor substrate 10 is preferably composed of monocrystalline silicon. Insulator layer 12 has been formed, patterned, and etched to provide contact opening 15 to the semiconductor substrate 10. Alignment cross mark 17 has been formed in another part of the integrated circuit. Alignment mark 17 is shown in the top view of FIG. 3 to be in the shape of a cross. The unshaded area 1 in FIG. 3 corresponds to openings 17 in FIG. 1.

Figure 3:
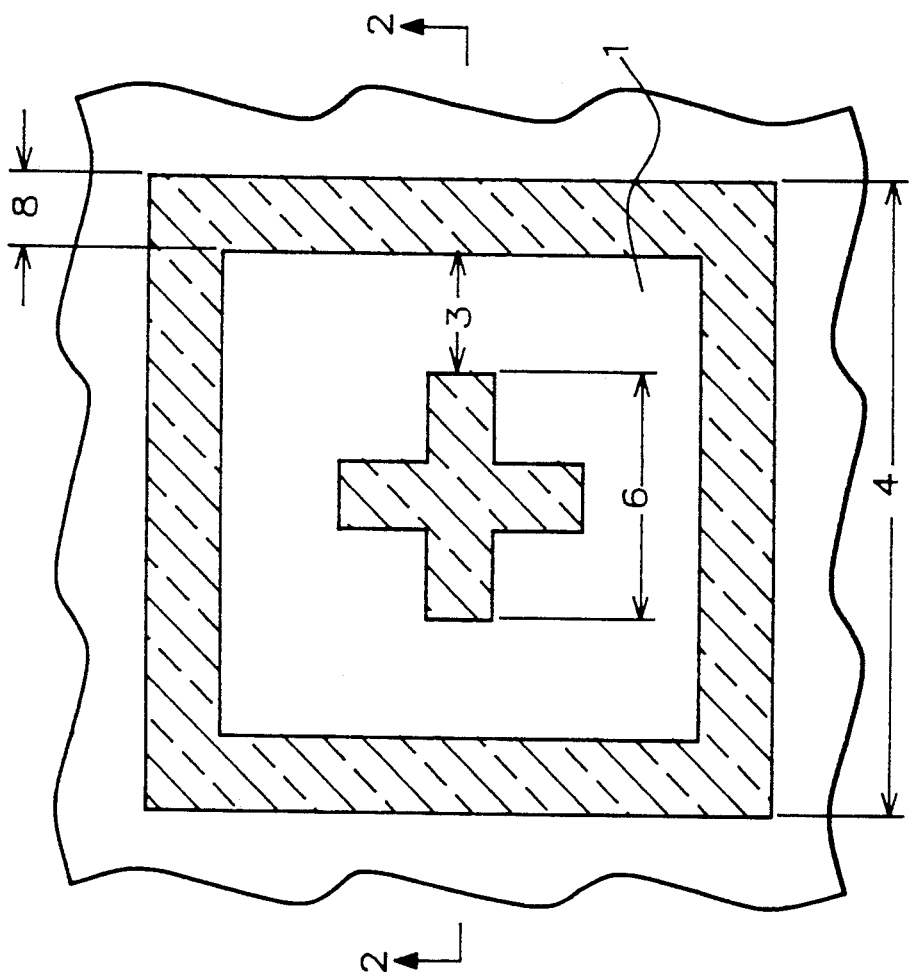
FIG. 3 schematically illustrates the top view of an alignment cross mark.

In the prior art, a hot sputtered layer of aluminum 30 adequately fills the contact or via opening 15, but also fills the alignment mark openings 17 wiping out the mark and making the mark difficult or impossible to detect. That is, unshaded area 1 in FIG. 3 is filled with aluminum. Alignment is based on the ability to pick out the edge of the cross 5. If region 1 is planarized with metal, then the cross definition is lost. A separate masking step can be introduced to etch out the metal from region 1.

However, it is desired to adequately fill the contact openings with metal without completely filling the alignment marks. Using the multi-step, multi-temperature, multi-power process of the invention, it is possible to improve the typical step coverage from about 10 to 40% without changing the existing reticle set.

Figure 2:
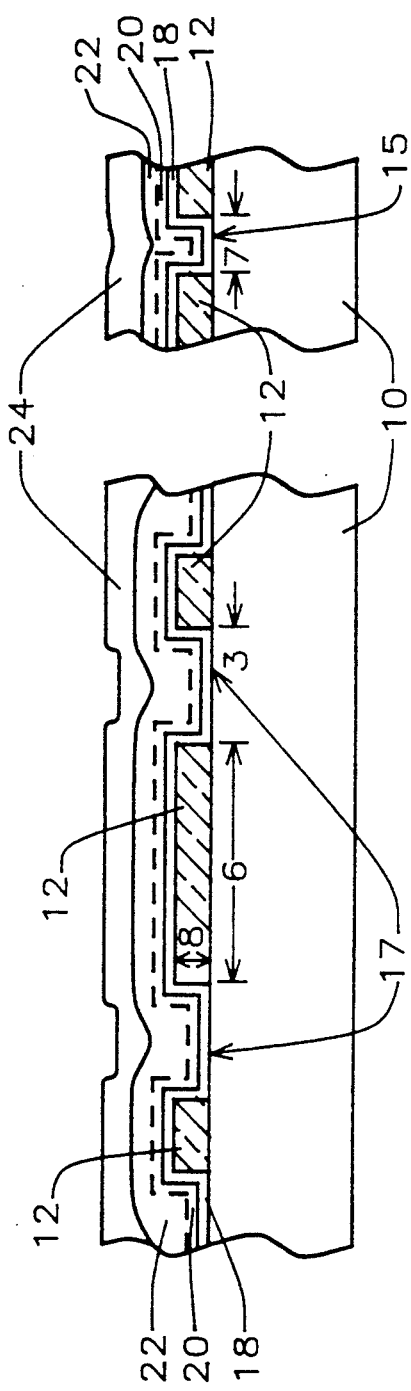
FIG. 2 schematically illustrates in cross-sectional representation one preferred embodiment of this invention.

Referring now to FIG. 2, there is shown the same portion of a partially completed integrated circuit as that shown in FIG. 1. As above, insulator layer 12 has been formed, patterned, and etched to provide contact opening 15 to the semiconductor substrate 10. Alignment cross mark 17 has been formed in another part of the integrated circuit. Alignment mark 17 is shown in the top view of FIG. 3 to be in the shape of a cross. For an alignment mark of length 60 micrometers (length 4 in FIG. 3), length 6 of the cross mark, shown in cross-section in FIG. 2 and in top view in FIG. 3, is 40 micrometers. Openings 17 have a width of 4 micrometers (length 3). The thickness of insulator layer 12 is approximately 0.6 micrometers (length 8).

For the process of the invention, a single pump down multi-chamber system is required for the aluminum deposition. Such vacuum chambers are described in *VLSI TECHNOLOGY*. International Edition, ed. by S. M. Sze, McGraw-Hill Book Company, NY, NY, c. 1988, 1983 by Bell Telephone Laboratories, Inc., pp.386-391.

The first step in the process of the invention is to sputter a barrier layer 18 of TiW or TiN to a thickness of between about 1000 to 1500 Angstroms. The temperature of this sputtering is not critical, but could be between about 100° to 400° C. The power used is between about 3 to 4 watts The next step is a cold metal seed layer 20 which will promote adhesion of the subsequent hot metal layer. This cold layer is sputtered at a temperature of less than about 150° C. and preferably between about 100° and 200° C. The power used is between about 5 to 10 watts. The thickness of this cold layer 20 is critical to ensure complete coverage of all surfaces of the contact openings. The thickness is to be optimized based on the sputtering conditions and the aspect ratio of the openings If the layer is too thick, a void may be created within the contact opening that may not be overcome by the subsequent hot reflow. The preferred thickness of the cold metal layer is between about 1500 to 2000 Angstroms. The metal may be aluminum or titanium.

The second metallization step is a hot metal flow layer 22. This layer is sputtered at a temperature of between about 475° to 550° C. with a preferred temperature of 500° C. Power used is between about 5 to 10 Kev. The hot metal layer 22 is sputtered to a preferred thickness of between about 2000 to 4000 Angstroms. It must be thick enough to fill the contact opening 15, but not thick enough to completely fill the alignment mark openings 17. This step fills the small contact or via openings, providing good step coverage. However, the hot metal layer 22 also blurs the edge of the alignment cross. Another step is required to redefine the alignment target.

The final metallization step is a second cold metal layer 24. This layer is sputter deposited at a temperature of between about 100° to 200° C., using a power of between about 5 to 10 Kev. The preferred thickness of cold metal layer 24 is between about 2000 to 5000 Angstroms. This is a directional sputtering which covers small contact or via opening 15, but produces cusp-like edges in the wide alignment mark openings 17. This shadowing nature of the cold deposition serves to recreate the cross edge that was planarized by the previous hot deposition. Good step coverage of the contact or via openings has been achieved while maintaining an effective alignment cross mark structure.

Figure 4:
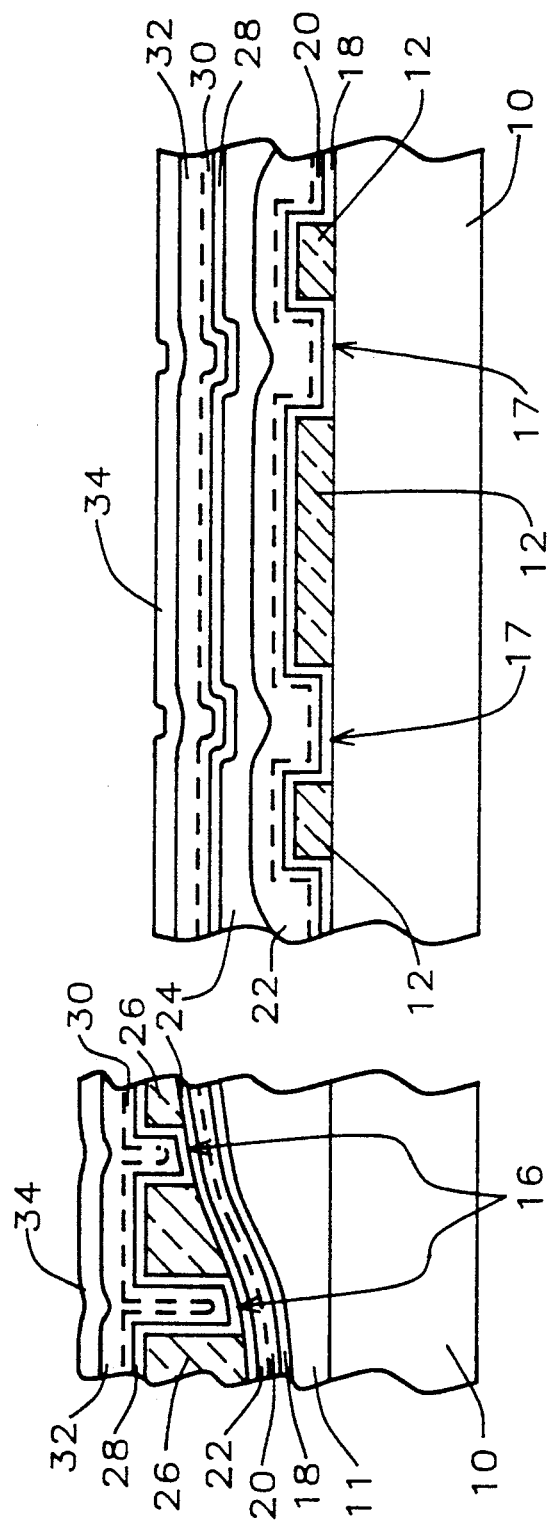
FIG. 4 schematically illustrates in cross-sectional representation another preferred embodiment of this invention.

Referring now to FIG. 4, there is shown a partially completed integrated circuit in which the first metallization, as described above, has been completed. There is shown silicon substrate 10 and insulator layer 11 which may be composed of more than one layer. First metal layer 25 comprises the barrier layer, cold metal seed layer, hot metal flow layer, and second cold metal layer 18, 20, 22, and 24 respectively, as shown in FIG. 2. Alignment cross mark openings 17 are shown as in FIG. 2. Contact openings 16 have been made through second insulating layer 26 to the first metal layer 25.

The second metallization proceeds in the same manner as the first metallization described above. Barrier layer 28 of TiW or TiN is formed in the contact openings 16, alignment mark openings 17, and over surfaces of insulating layer 26. The thickness is 1000 to 1500 Angstrom as described above. Temperature and power are as above.

Cold metal seed layer 30 is sputtered at a temperature of less than about 150° C. and preferably between about 100° and 200° C. and a power of between about 5 to 10 Kev. As above, the preferred thickness of this layer is between about 1500 to 2000 Angstroms.

The hot metal layer 32 is sputtered at a temperature of between about 475° to 550° C. with a preferred temperature of 500° C. and power of between about 5 to 10 Kev. As above, the hot metal layer must be thick enough to fill the contact openings 16, but not thick enough to completely fill the alignment marks 17.

The second cold metal layer 34 is sputter deposited at a temperature of between about 100° to 200° C., using a power of between about 5 to 10 Kev. The preferred thickness of cold metal layer 24 is between about 2000 to 5000 Angstroms. This top layer covers small contact or via openings 16, but again produces cusp-like edges in the wide alignment mark openings 17. This shadowing nature of the cold deposition serves to recreate the cross edge that was planarized by the previous hot deposition.

Note that the aspect ratio is greater for the second metallization layer than for the first metallization layer. The process of the invention is sufficient to provide good step coverage for both metal I and metal II layers while maintaining an effective alignment cross mark structure.

While the invention has been particularly shown and described with reference to the preferred embodiments thereof, it will be understood by those skilled in the art that various changes in form and details may be made without departing from the spirit and scope of the invention.

What is claimed is:

1. The method of metallization of an integrated circuit while maintaining an effective alignment cross mark structure comprising:

providing semiconductor device structures in and on a semiconductor substrate;

providing at least one contact opening to said semiconductor substrate and an alignment cross mark opening structure on said semiconductor structure;

cold sputtering an aluminum seed layer conformally and completely covering all surfaces of said contact openings and said cross mark opening structure;

hot sputtering an aluminum layer which flows aluminum into said contact openings and said cross mark openings; and cold sputtering an aluminum layer over said hot layer which is a directional deposition that forms cusplike edges in the wide said alignment cross mark opening structure and which obtains said effective alignment cross mark structure.

2. The method of claim 1 wherein a barrier layer is located under said aluminum seed layer and said barrier layer is composed of TiW.

3. The method of claim 1 wherein a barrier layer is located under said aluminum seed layer and said barrier layer is composed of TiN and has a thickness of between about 1000 to 1500 Angstroms.

4. The method of claim 1 wherein said cold aluminum seed layer is deposited at a temperature of less than about 200° C. to a thickness of between about 1500 and 2000 Angstroms.

5. The method of claim 1 wherein said hot metal flow layer is deposited at a temperature of between about 475° to 550° C. to a thickness of between about 2000 to 4000 Angstroms to obtain desired step coverage.

6. The method of claim 1 wherein said cold aluminum layer over said hot layer is deposited at a temperature of less than about 200° C. to a thickness of between about 2000 to 5000 Angstroms.

7. The method of metallization of an integrated circuit comprising:

providing semiconductor device structures in and on a semiconductor substrate;

providing a first metallization layer within said device structures;

providing at least one contact opening to said first metallization layer;

providing at least one lithography alignment cross mark opening structure among said device structures;

cold sputtering an aluminum seed layer conformally and completely covering all surfaces of said contact openings and said cross mark opening structure;

hot sputtering an aluminum layer which flows hot aluminum into said contact openings and said cross mark openings; and cold sputtering an aluminum layer over said hot layer which is a directional deposition that forms cusplike edges in the wide said alignment cross mark opening structure and which obtains said effective alignment cross mark structure.

8. The method of claim 7 wherein a barrier layer is located under said aluminum seed layer and said barrier layer is composed of TiW.

9. The method of claim 7 wherein barrier layer is located under said aluminum seed layer and said barrier layer is composed of TiN and has a thickness of between about 1000 to 1500 Angstroms.

10. The method of claim 7 wherein said cold aluminum seed layer is deposited at a temperature of less than about 200° C. to a thickness of between about 1500 and 2000 Angstroms.

11. The method of claim 7 wherein said hot metal flow layer is deposited at a temperature of between about 475° to 550° C. to a thickness of between about 2000 to 4000 Angstroms to obtain desired step coverage.

12. The method of claim 8 wherein said cold aluminum layer over said hot layer is deposited at a temperature of less than about 200° C. to a thickness of between about 2000 to 5000 Angstroms.

* * * * *